United States Patent [19]

Young

[11] Patent Number: 5,382,483

[45] Date of Patent: Jan. 17, 1995

[54] SELF-ALIGNED PHASE-SHIFTING MASK

[75] Inventor: Malcolm A. Young, Manassas, Va.

[73] Assignee: International Business Machines Corporation, Armonk, N.Y.

[21] Appl. No.: 821,385

[22] Filed: Jan. 13, 1992

[51] Int. Cl.$^6$ ............................................. G03F 9/00
[52] U.S. Cl. .................................... 430/5; 430/311; 430/320; 430/321
[58] Field of Search .................... 430/5, 320, 321, 311

[56] References Cited

U.S. PATENT DOCUMENTS

| | | | |
|---|---|---|---|
| 3,615,471 | 10/1971 | Lenoble et al. | 96/38.3 |
| 3,742,229 | 6/1973 | Smith et al. | 250/65 R |
| 4,377,627 | 3/1983 | Vinton | 430/22 |
| 4,707,218 | 11/1987 | Giammarco | 156/643 |
| 4,885,231 | 12/1989 | Chan | 430/321 |
| 5,045,417 | 9/1991 | Okamoto | 430/5 |

FOREIGN PATENT DOCUMENTS

| | | |
|---|---|---|
| 0489540 | 6/1991 | European Pat. Off. . |
| 0437376 | 7/1991 | European Pat. Off. . |
| 0453310 | 10/1991 | European Pat. Off. . |
| 4215210 | 5/1991 | Germany . |
| 2154204 | 6/1990 | Japan . |
| 2211450 | 8/1990 | Japan . |
| 2247647 | 10/1990 | Japan . |
| 2287542 | 11/1990 | Japan . |

OTHER PUBLICATIONS

New Phase Shifting Mask with Self-Aligned Phase Shifter for a Quarter Micron Photolithography, 1989 IEEE, Akihiro Nitayama, et al.

Mask Contrast Enhancement Using Beveld Edge in X-Ray Lithography, Hasegawa Microelectronic Engineering 1989.

New Phase-Shifting Mask with Highly Transparent SiO2 Phase Shifters Hanyu, et al., SPIE vol. 1264, 1990.

Improving Resolution in Photolithography with a Phase-Shifting Mask 1982 IEEE, Marc D. Levenson, et al.

Transparent Phase Shifting Mask, 1990 IEEE, H. Watanabe, et al.

0.3-micron optical lithography using a phase-shifting mask SPIE vol. 1088 Optical/Laser Microlithography II (1989), Tsuneo Terasawa, et al.

Fabrication of 64M Dram With i-Line Phase-Shift Lithography, 1990 IEEE K. Nakagawa, et al.

A 5.9 um$^2$ Super Low Power Sram Cell Using A New Phase-Shift Lithography 1990 IEEE, T. Yamanaka, et al.

JP4040455, Ikeda Rikis, "Manufacture of Phase Shift Mask", (Pub. 10 Feb. 1992) one page.

JP4146617, Matsuoka Koji, "Pattern Forming Method", (Pub. 20 May 1992) one page.

*Primary Examiner*—Marion E. McCamish
*Assistant Examiner*—Mark A. Chapman
*Attorney, Agent, or Firm*—Jeffrey S. La Baw; William P. Skladony

[57] ABSTRACT

A phase-shifting mask with self-aligned spacers of phase-shift material adjacent to the edges of the opaque mask pattern and a method for making the same is disclosed. The method of the invention deposits a blanket layer of an appropriate phase-shift material over a transparent mask substrate having a patterned opaque layer followed by a removal step which forms the spacers. The mask is preferably comprised of a quartz substrate covered with a patterned chrome layer fabricated following the normal inspection and repair procedure. A layer of phase-shift material is then blanket deposited. The thickness and index of refraction of the phase-shift material is chosen to provide a phase-shift of 0.67 pi radians (120 degrees) to pi radians (180 degrees) in the completed mask which is the range of phase-shift demonstrated to be effective. The phase-shift layer is then blanket etched anisotropically in a Reactive Ion Etch (RIE) chamber, using the chrome and quartz as etch stops. Following the etch, the remaining phase-shift material forms a roughly quarter-cylinder cross-section shaped spacer pattern. The spacer pattern is self-aligned to the edges of the opaque mask pattern.

18 Claims, 11 Drawing Sheets

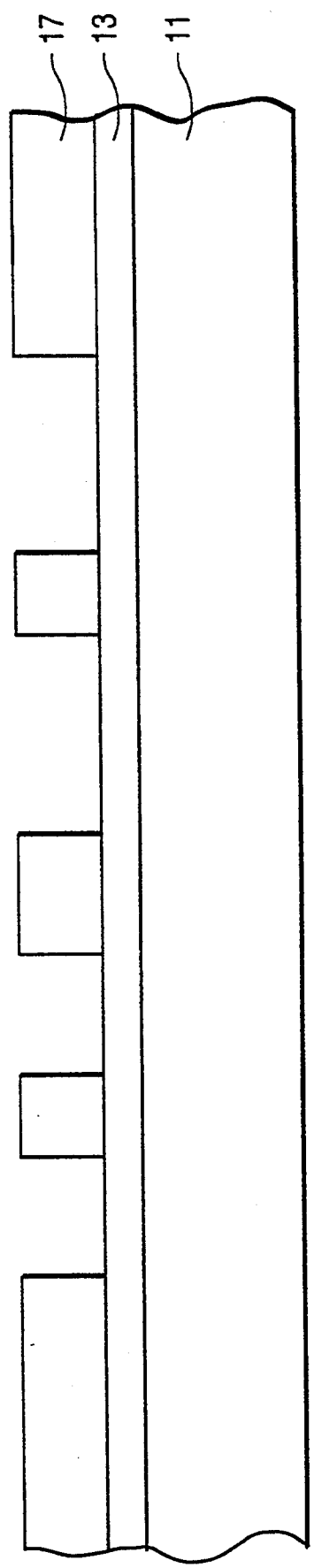

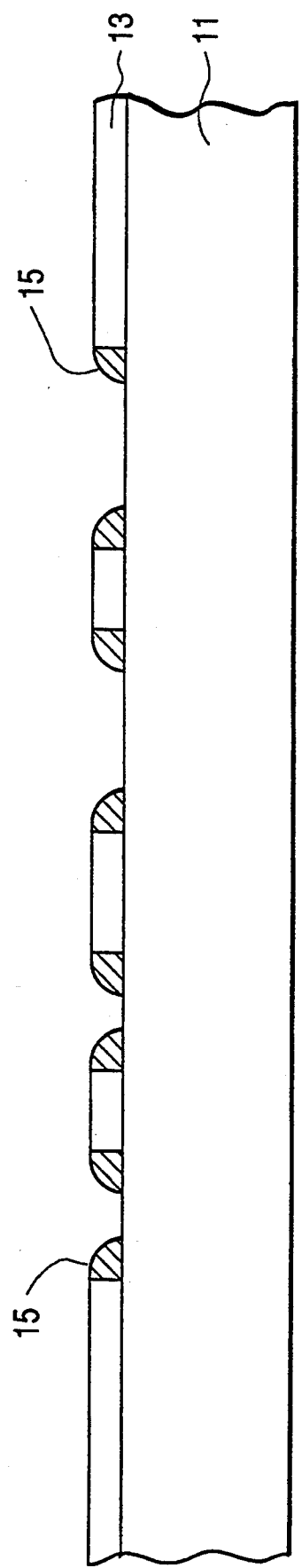

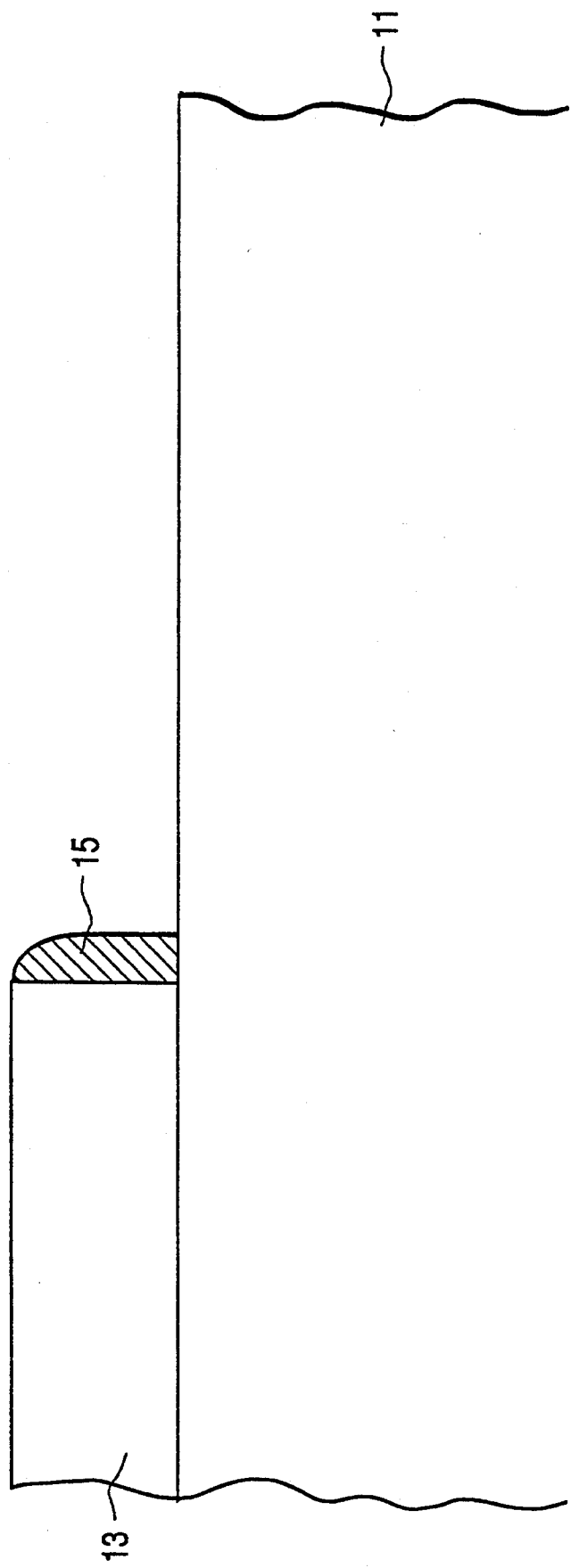

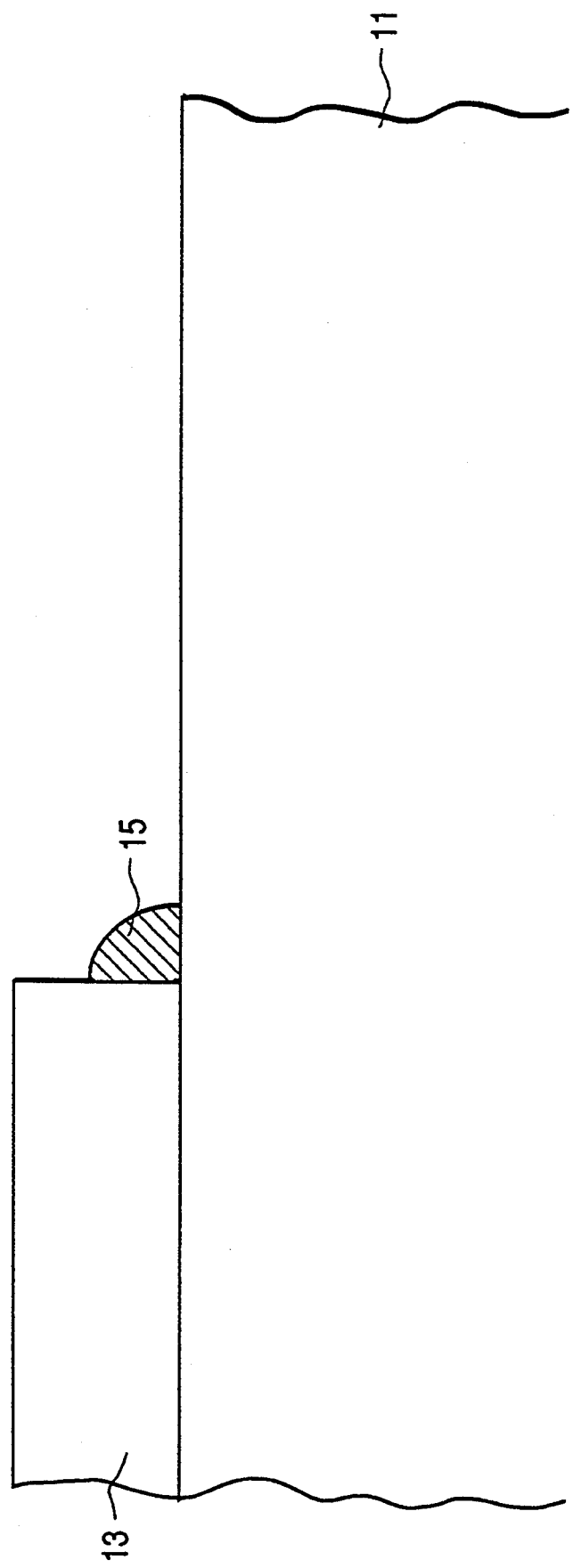

SELF-ALIGNED PHASE-SHIFTING MASK

BACKGROUND OF THE INVENTION

This invention relates generally to photolithographic masks used in semiconductor chip fabrication. More particularly, it relates to a self-aligned phase-shifting mask and a method for making the same.

Transmission masks are widely used for exposing a desired lithography pattern onto a photoresist covered substrate, e.g., a silicon wafer. Various etching, deposition or implantation processes are typically contemplated with the patterned substrate. Transmission masks are composed of a substrate material transparent to the exposing radiation selectively coated in areas of the substrate with a material opaque to the radiation corresponding to areas of the photoresist which are to be unexposed. For radiation in the visible and ultraviolet spectrum, a substrate of quartz and a coating of chrome are well known choices.

In advanced submicron photolithography, exposure systems typically use transmission masks with short wavelength ultraviolet light and high numerical aperture reduction lens systems to provide a maximum in image resolution. However, diffraction effects at the boundaries of the opaque masking material between adjacent clear areas cause spreading of the light into areas of the resist which were intended to remain unexposed. This effect degrades the image contrast by causing unwanted lateral exposure of the photoresist, thus limiting the resolution and tolerance control capability of the exposure system.

Marc Levenson in "Improving Resolution in Photo Lithography with a Phase-Shifting Mask", IEEE Trans. on Electronic Devices, Vol. ED-29, December 1982, originally proposed phase-shifting masks to improve the pattern image resolution and tolerance control by creating out-of-phase, destructive interference at the dark-light boundaries of adjacent apertures. A phase-shifting mask takes advantage of the phenomenon that light transmission through a transparent material exhibits temporal phase-shifting in accordance with the following relationship:

Delta-phi=2pi(n−1)d/lambda where delta-phi is the phase-shift in radians, n is the index of refraction of the transmission material, d is the thickness of the material in meters and lambda is the wavelength of the exposing radiation in meters. By using two different mask transmission materials with the appropriate thicknesses and indices of refraction, one can provide a 180 degree phase-shift at the light-dark boundaries to improve the signal contrast.

Several phase-shifting masks have been proposed or demonstrated which apply and improve on the original concept. All of the masks use added or substituted transmission layers in selected areas to produce phase-shifting. However, the prior art masks require a second mask patterning sequence as they do not provide for self-aligned location of the phase-shift pattern. Many of these methods require significant changes to the existing mask industry processes. Further, a major difficulty with the fabrication of any lithography mask is the repair of and inspection for defects which are unavoidable. Many of the phase-shifting techniques use new materials for which inspection and repair techniques do not exist.

The present invention represents an improvement in phase-shifting masks.

SUMMARY OF THE INVENTION

It is therefore an object of the present invention to provide a self-aligned phase-shifting mask.

It is another object of the invention to fabricate a phase-shifting mask with a single lithography step.

It is another object of the invention to manufacture the phase-shifting mask with a process which is compatible with the existing processes for the fabrication of a lithographic mask.

It is another object of the invention to allow conventional inspection and repair techniques to be used for a phase-shifting mask.

These objects and others are accomplished by a phase-shifting mask with self-aligned spacers of phase-shift material adjacent to the edges of the opaque mask pattern. The method of the invention deposits a blanket layer of an appropriate phase-shift material over a transparent mask substrate having a patterned opaque layer, followed by a blanket etch step to produce the spacers.

In the preferred embodiment, the mask is comprised of a quartz substrate covered with a patterned chrome layer fabricated using the normal inspection and repair procedure. A conformal layer of phase-shift material is then blanket deposited. The thickness and index of refraction of the phase-shift material is chosen to provide a phase-shift of 0.67 pi radians (120 degrees) to pi radians (180 degrees) in the completed mask which is the range of phase-shift demonstrated to be effective. The phase-shift layer is then blanket etched anisotropically in a Reactive Ion Etch (RIE) chamber, using the chrome and quartz as etch stops. Following the etch, the remaining phase-shift material forms a roughly quarter-cylinder cross-section shaped spacer pattern. The spacer pattern is self-aligned to the edges of the opaque mask pattern. In the preferred embodiment, where the spacer contacts the opaque layer edge, it is approximately the same thickness as the opaque material and decreases to zero thickness at a distance approximately equal to the opaque layer thickness from the edge. The blanket etch removes all the remaining phase-shift material in the clear field areas and on top of the opaque areas. Thus, the only photolithography process required is that associated with making the opaque mask areas; none are needed for the phase-shifting spacers. Other spacer shapes are possible in other embodiments of the invention.

BRIEF DESCRIPTION OF THE DRAWINGS

These features and objects will be more easily understood with reference to the following figures.

FIGS. 3A–3E are cross-sectional diagrams of the process steps to fabricate the mask of the present invention.

FIGS. 4A–4B are cross-sectional diagrams of a second embodiment of the invention.

FIG. 5 is a cross-sectional diagram of a third embodiment of the invention.

DETAILED DESCRIPTION OF THE DRAWINGS

Figure 1:
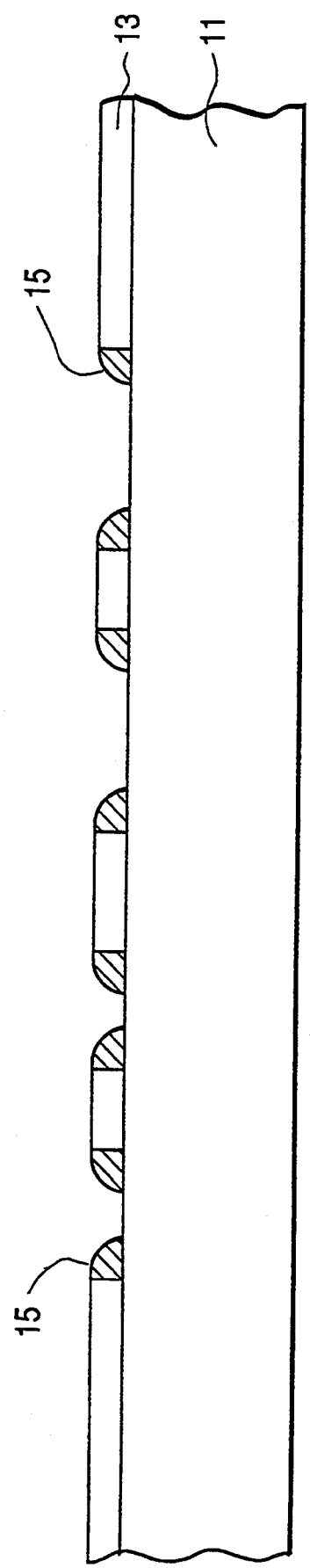
FIG. 1 is a cross-sectional diagram of the completed phase-shifting mask according to the present invention.

Referring to FIG. 1, a cross-sectional diagram of a section of the completed phase-shifting mask is shown. Transparent layer 11 serves as a substrate for the patterned opaque layer 13 and self-aligned phase-shifting spacers 15. The transparent layer 11 is chosen to transmit the wavelength of radiation used to expose a photoresist covered substrate (not shown), typically a semiconductor wafer. For visible and ultraviolet wavelengths, fused quartz is a preferred transparent substrate 11 which is prevalently used in the industry. Fused silica is another substrate which is commonly used in optical mask design. The choice of substrate is based on the wavelength spectrum for which the substrate material must have excellent optical transmittance in the clear areas. The quartz substrate typically runs in the range of 4 to 10 millimeters in thickness.

The opaque masking material 13 is chosen to absorb or reflect the exposing radiation, thus preventing exposure of the corresponding areas of the photoresist. Chrome is the industry standard for optical and ultraviolet masks. Chrome is used as an absorber based on its compatibility with the substrate, quartz, and the processes used for fabricating the mask, as well as other characteristics such as E-beam back scattering properties. Although chrome is a typical opaque absorber material, the invention is adaptable to other opaque materials. Preferably, the opaque material provides an etch stop for the blanket etch back of the phase-shifting material. A typical thickness of the chrome layer 13 is 0.1 micrometers, however, to accommodate the teachings of the invention it may be thicker depending on the respective refractive indices of the transparent substrate 11 and the spacers 15.

In the preferred embodiment, the spacers 15 are quarter-cylinders in cross-section and are approximately as thick and wide as the chrome layer is thick. A list of a few suitable materials for the phase-shifting spacers and their respective refractive indices are listed in Table I. While the table is not exhaustive, the desirable phase-shifting material should have excellent transmittance in the wavelength of the exposing radiation. Further, the phase-shifting material should optimally have an index of refraction of refraction in the region of 2.0 to 3.0 to avoid significantly increasing the thickness of the chrome layer from the 0.1 micrometer industry standard practice.

TABLE I

| Material | Index of Refraction (n) g-line | i-line | Transmittance |
| --- | --- | --- | --- |
| Silicon Nitride ($Si_3N_4$) | 2.10 | 2.04 | >90% |
| Magnesium Fluoride ($MgF_2$) | 1.39 | 1.38 | >90% |
| Thorium Fluoride ($ThF_4$) | 1.53 | 1.53 | >70% |

To achieve a phase-shift of 180 degrees while maintaining the industry standard chrome thickness of 0.1 micrometers would require a material with an index of refraction of about 3.2, for g-line radiation according to the equation in the background.

To achieve a phase-shift of 120 degrees while maintaining 0.1 micrometers thickness for g-line radiation would require a material with refractive index of about 2.5, referring to the same equation. That implies that all of the materials in Table I will require an increase in the chrome thickness.

Typical wavelengths for the exposing radiation presently practiced are in the ultraviolet range of 0.436–0.365 micrometers. In the future, it is expected that shorter wavelengths will be used. If silicon nitride were used as the material for the spacers 15, thicknesses in the range of 0.12 to 0.2 micrometers would cause phase-shifts of 120 to 180 degrees for the ultraviolet range above. Thus, using silicon nitride, the chrome will be in same range, but possibly somewhat thicker than industry standards.

A series of calculations for g-line (0.436 micron wavelength) and i-line (0.365 micron wavelength) exposing radiation, for silicon nitride as the spacer material, with the following results are shown in Table II:

TABLE II

| A - For Fixed Chrome Thickness of 0.1 micrometers | |
| --- | --- |
| Material | Phase Shift vs. Wavelength |
| $Si_3N_4$ | (g-line) 91 degrees |
| | (i-line) 103 degrees |
| B - For Fixed Phase Shift (180 degrees) | |
| Material | Chrome Thickness (micrometers) |
| $Si_3N_4$ | (g-line) 0.198 |
| | (i-line) 0.175 |
| C - For Fixed Phase Shift (120 degrees) | |
| Material | Chrome Thickness (micrometers) |
| $Si_3N_4$ | (g-line) 0.133 |
| | (i-line) 0.118 |

From the above, the following can be concluded: a) for g-line with 120 degree phase-shifting, the required thickness increase over standard chrome is about 33%, while 180 degree phase-shifting the thickness is about doubled; b) for i-line and 120 degree phase-shifting, the increase over standard chrome is only 18% while 180 degree phase-shifting requires a 75% thickness increase; c) recognizing that the present and future trend of wavelength usage in the industry is toward i-line, an increase in chrome mask absorber material of 18–75% will be typically required.

Figure 2:
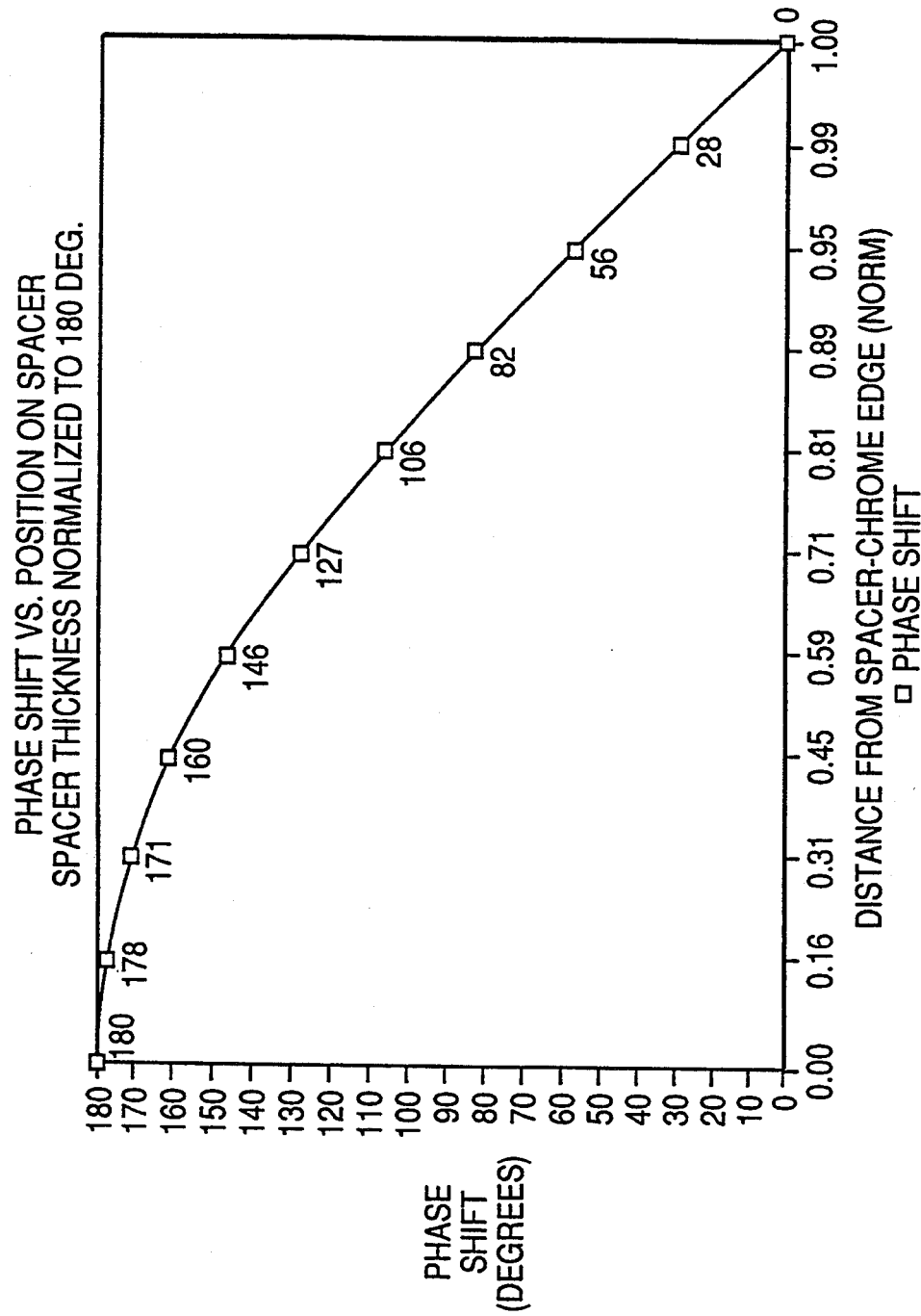
FIG. 2 is a graph of phase-shift vs. normalized position along the phase-shifting spacer.

FIG. 2 depicts the phase-shift caused by the idealized phase-shifting spacer of FIG. 1 at various points along the spacer. The spacer is sufficiently thick at the chrome-spacer interface to create a 180 degree phase-shift and is a perfect quarter cylinder in cross-section. As can be seen, the phase-shift varies continuously from 180 degrees to zero degrees. The intensity distribution between light and dark areas is improved if the phase-shift varies gradually from degrees to zero degrees. Thus, the present invention is a distinct improvement over the single-step phase-shifters of the prior art.

The process steps to fabricate the phase-shifting mask of FIG. 1 are described with reference to FIGS. 3A–3E. In FIG. 2A, a layer of opaque material 13 is shown deposited on the transparent substrate 11. Evaporation is typically used for the chrome masking layer disposition followed by resist coating and patterning. The fabrication process for the underlying chrome-quartz mask is well known in the art. One of the objects of the invention is to produce a phase-shifting mask with processes which are as compatible with the conventional industry standards as possible. In the preferred embodiment, the thickness of the opaque layer 13 should equal the desired thickness of the spacer in the completed mask. Patterned photoresist layer 17 is then formed, typically using conventional electron-beam lithography techniques. After the opaque material is etched, conventional inspection and repair procedures are carried out. The remaining resist 17 is stripped off resulting in the structure shown in FIG. 3B, a conventional optical photomask.

Figure 3B:
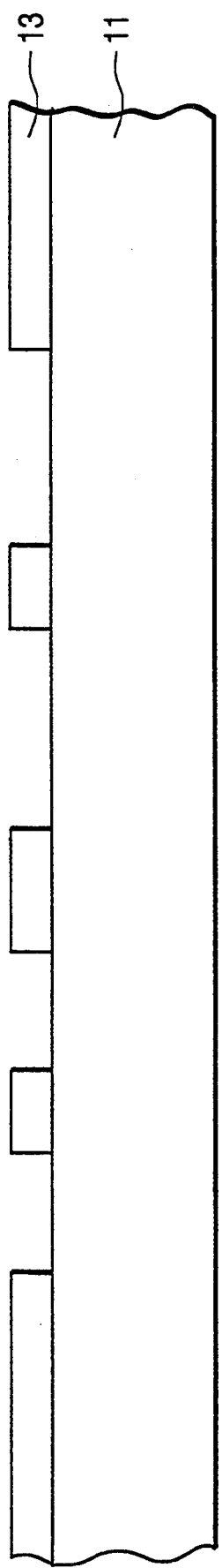
Figure 3C:
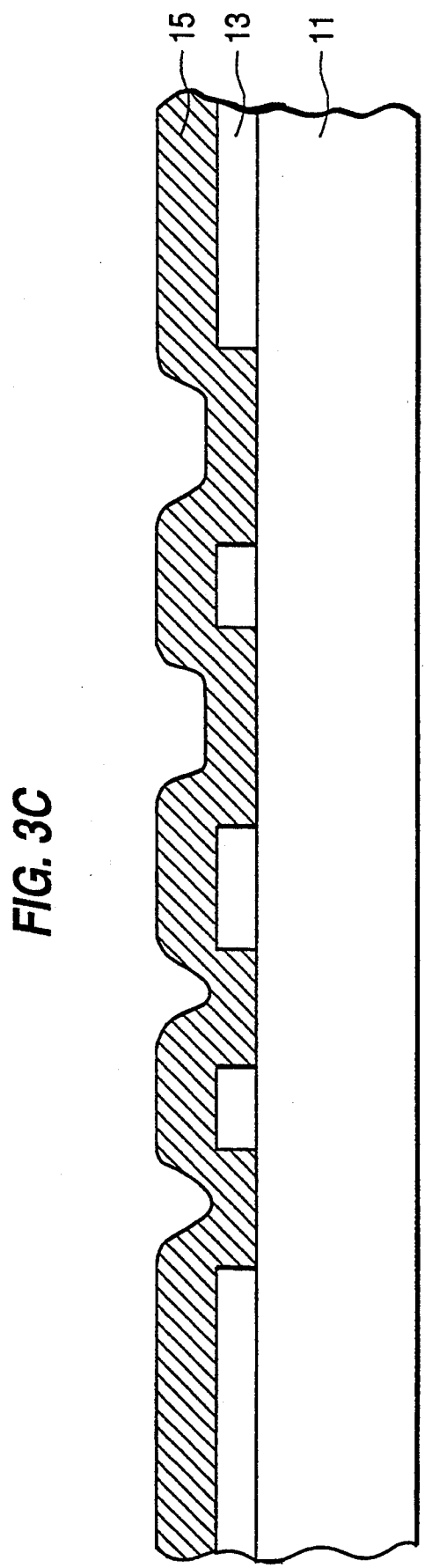

After the opaque mask 13 is formed as shown in FIG. 3B, a conformal deposition of the phase-shifting material 15 is performed as shown in FIG. 3C. It is preferred that the coating be as conformal as possible to simplify spacer formation during etch with a minimum of substrate and opaque mask removal. Well known deposition techniques such as low pressure chemical vapor deposition (LPCVD), plasma enhanced chemical vapor deposition (PECVD), atmospheric pressure chemical vapor deposition (APCVD) or sputtering can be used for the deposition depending on the phase-shifting material. In the preferred embodiment, the phase-shifting material should be deposited at least as thick as the eventual spacer thickness. The silicon nitride deposition is typically a noncrystaline film prepared by high-temperature, low-pressure pyrolytic decomposition of a mixture of silane ($SiH_4$) and ammonia ($NH_3$), to achieve a conformal coating with nearly ideal stochiometry. The process may be plasma assisted as required.

Figure 3D:
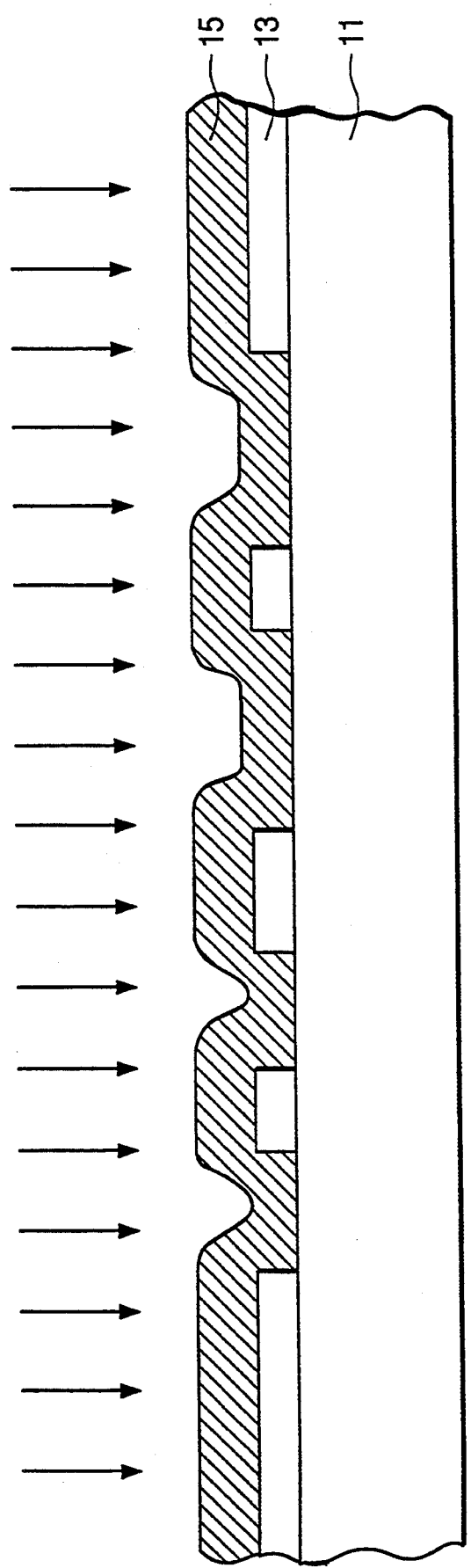

Next, an anisotropic etch is performed in a RIE reactor represented by the arrows in FIG. 3D. As is well known in the art, an anisotropic etch etches predominantly in the vertical direction, having little to no horizontal undercut. It is preferred that the etch process be highly selective to the spacer material 15, leaving the transparent substrate 11 and opaque material 13 relatively unetched. The blanket etch process for silicon nitride typically would be carried out with carbon tetrafluoride ($CF_4$) with 10% hydrogen ($H_2$) at low pressure (less than 50 milliTorr) in a plasma etch tool operating in reactive ion etch (RIE) mode, to produce an anisotropic (vertical) etching result with minimum etch bias. The large expanses of the chrome 13 and quartz 11 relative to the spacer size as shown in FIG. 3E provide a very clear endpoint for the etch process. However, if the etch process was not highly selective to the phase-shifting material 15 versus the substrate 11, some overetch is easily tolerated as the substrate is very thick relative to the spacer material which is only a few hundred nanometers thick. As the thickness of the spacer material immediately adjacent to the edge of the opaque pattern 13 is greater than on the large expanse of quartz 11 and chrome 13, spacers 15 remain at etch endpoint.

Figure 4A:
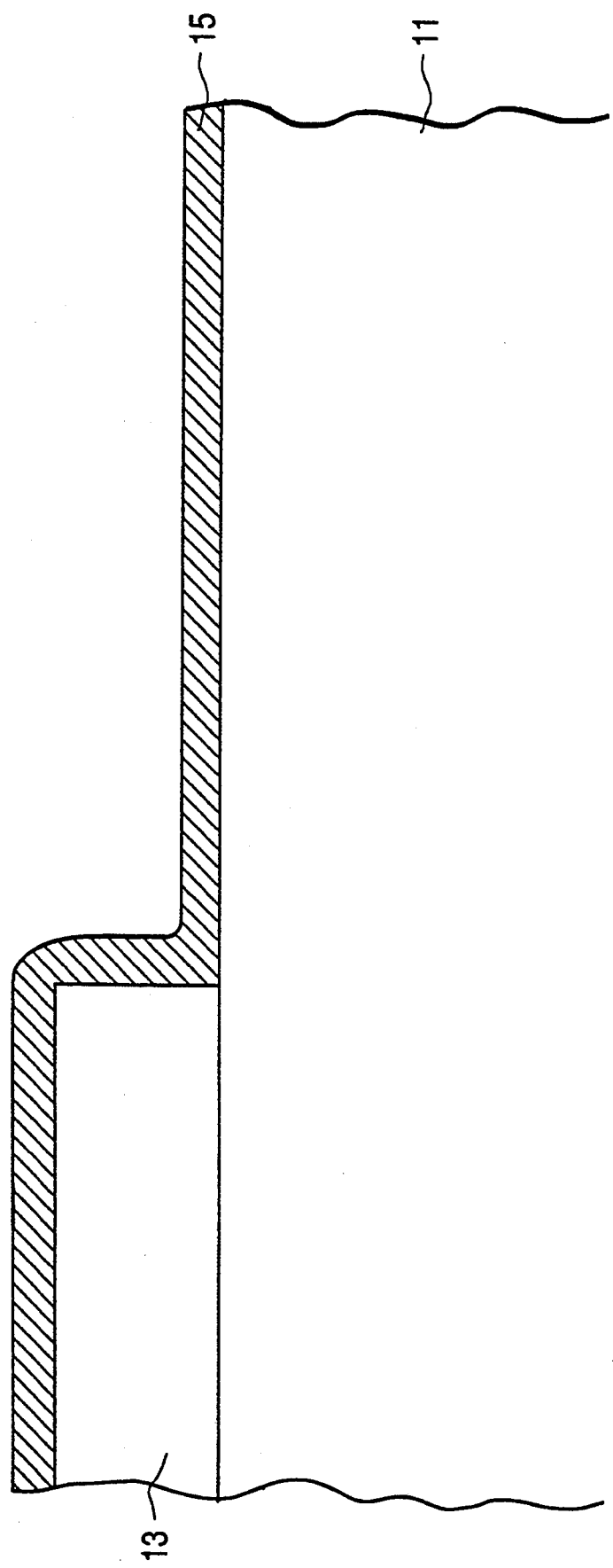

Other spacer shapes and sizes are encompassed by the present invention. By the nomenclature of the present description, all of these shapes are considered to be roughly quarter-cylindrical in cross-section. For example, in FIGS. 4A and 4B, a second embodiment of the invention is shown. In FIG. A, a thinner layer of the phase-shifting material 15 is deposited over the chrome 13 and quartz 11. After etching the phase-shift material, the spacer 15 formed as shown in FIG. 4B is much thinner than it is tall. A thinner spacer may have advantages in tightly packed areas. Also, the variation in height, and therefore, in the phase-shift experienced by the exposing radiation is less over the width of the spacer.

In fact, with the proper choice of phase-shifting material 15, the deposited thickness of the phase-shifting material and thickness of the opaque mask material 13, it is possible, albeit less preferred, to eliminate the etch step. As the coating of the spacer material 15 is conformal, the areas immediately adjacent to the opaque material have a height greater than in the field areas some distance from the opaque pattern. Although all the exposing radiation will be phase-shifted to some degree, it is possible to adjust the thicknesses of materials such that the exposing radiation which goes through the spacer areas is phase-shifted in the range of 0.67 pi to pi radians from the exposing radiation which passes through the thinner thickness of phase-shifting material 15 in the field areas. Due to attenuation in the field areas, however, it is preferred to perform the etch step to remove the excess phase-shifting material 15.

In FIG. 5, the effects of an overetch of the spacer 15 shown in FIG. 3E is depicted. The spacer is thinner than the opaque mask 13, but still could be of the requisite thickness to accomplish the phase-shift. Rather than adjusting the chrome thickness as shown above in Table II, an over-etch is another way of tailoring the spacer height rather than changing the height for the desired phase-shift.

Figure 6:
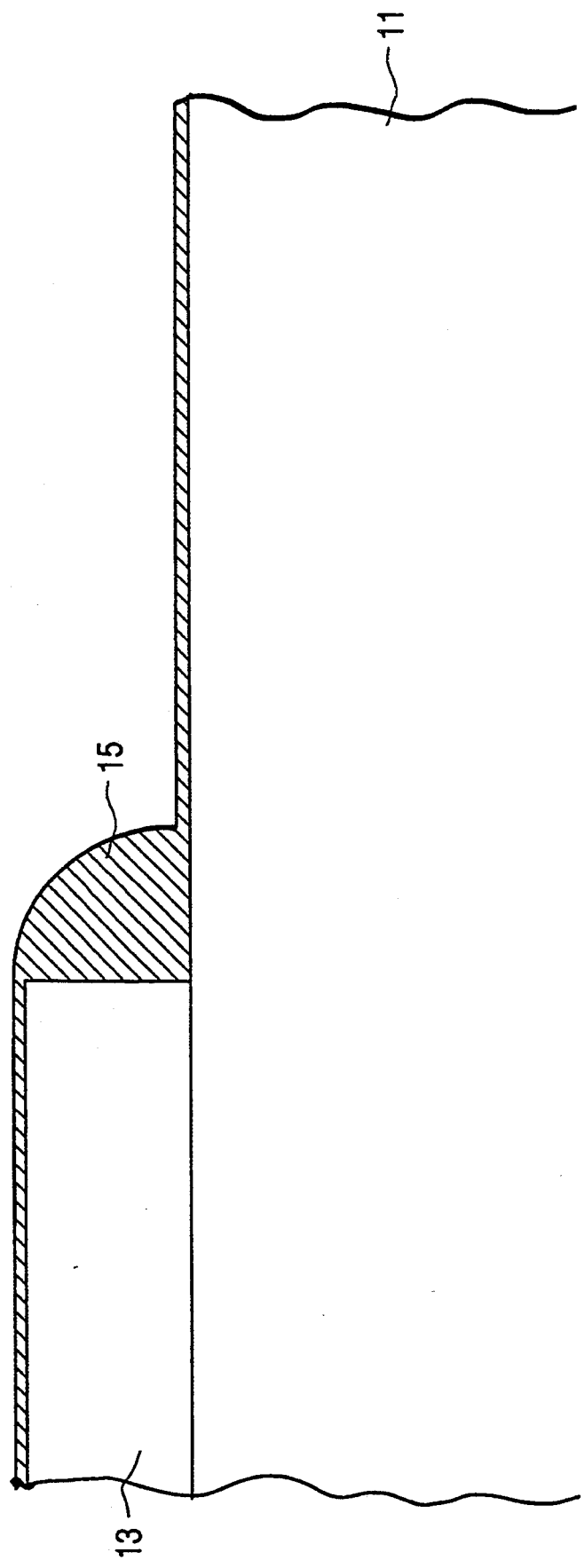
FIG. 6 is a cross-sectional diagram of a fourth embodiment of the invention.

In FIG. 6, yet another embodiment of the invention is shown. A thin layer of phase-shifting material is left over the clear areas of the transparent substrate 11 and the opaque masking areas 13 due to underetch. The phase-shifting material 15 over the opaque area 13 has no effect as the exposing radiation is absorbed or reflected in these areas. As discussed above, the phase-shift material in the transparent field areas is not desirable as it reduces the exposure energy to the resist. However, so long as the phase-shift due to the thick spacer area and the phase-shift due to the thin layer are 120 to 180 degrees out of phase, the current invention should work.

The phase-shifting masks of the present invention can be put to other uses besides semiconductor wafer fabrication. In X-ray lithography, a "mother" optical mask is used to fabricate a "daughter" X-ray mask. Through the use of the present invention, the resolution possible for X-ray lithography is also extended. The present invention is a simple means of converting a conventional optical mask into a self-aligned phase-shifting mask thus, improving the resolution possible with a minimum of extra cost.

While the present invention has been described by reference to the illustrative examples above, those skilled in the art would appreciate that modifications could be made from the specific embodiments without departing from the spirit and scope of the invention.

I claim:

1. A method for fabricating a self-aligned phase-shifted mask comprising the steps of:

exposing a mask to a single patterning sequence to form a pattern of material opaque to exposing radiation of a selected wavelength on selected areas of a surface of a substrate, the substrate being transparent to the exposing radiation, and the opaque pattern having a first surface which is generally orthogonal to the surface of the substrate and a second surface which is generally parallel to the surface of the substrate; and forming a spacer of phase-shifting material on the first surface of the opaque pattern by depositing phase-shifting material on the generally orthogonal surfaces of the opaque pattern and the transparent substrate, the spacer having a thickness at the first surface of the opaque pattern such that the exposing radiation passing through the spacer is phase-shifted in the range of 0.67 pi to pi radians with respect to exposing radiation passing through other areas of the mask.

2. The method as recited in claim 1 wherein the forming step further comprises the step of etching the phase-shifting material to substantially remove it from the generally parallel surfaces of the opaque pattern and the transparent substrate.

3. The method as recited in claim 1 wherein the thickness of the spacer at the first surface of the opaque pattern is substantially equal to a thickness of the opaque pattern.

4. The method as recited in claim 3 wherein a cross-sectional shape of the spacer is a quarter-cylinder with its greatest thickness at the first surface of the opaque pattern so that the greatest phase-shift of the exposing radiation is created at the first surface of the opaque pattern.

5. The method as recited in claim 1 wherein the transparent substrate is quartz and the opaque material is chrome.

6. A self aligned phase shifting mask comprising:
a substrate which is transparent to a selected wavelength of exposing radiation, said substrate having a surface;
a pattern of material opaque to the selected wavelength of exposing radiation disposed on selected areas of the transparent substrate, the opaque pattern having a first surface which is generally orthogonal to said substrate surface and a second surface which is generally parallel to said substrate surface; and
a self-aligned spacer of phase-shifting material formed on the first surface of the opaque pattern and the surface of the transparent substrate of a thickness to cause a phase-shift in the exposing radiation passing through the spacer of 0.67 pi to pi radians with respect to the exposing radiation which passes through other areas of the mask, and said spacer having a generally curvilinear cross sectional configuration.

7. The mask as recited in claim 6 wherein the thickness of the spacer at said first surface is substantially similar to the thickness of the opaque pattern.

8. The mask as recited in claim 6 wherein the phase shift material is substantially removed from the parallel surfaces of said opaque pattern and said transparent substrate.

9. The mask as recited in claim 7 wherein a cross-sectional shape of the spacer is a quarter-cylinder with a greatest thickness at the first surface of the opaque pattern so the greatest phase-shift of the exposing radiation is created at the first surface of the opaque pattern.

10. The mask as recited in claim 6 wherein the transparent substrate is quartz and the opaque material is chrome.

11. A method of converting an optical lithography mask into a self-aligned phase shifting mask, the mask having a patterned opaque material on selected areas of a surface of a substrate, the substrate being transparent to the exposing radiation, and the opaque pattern having a first surface which is generally orthogonal to the surface of the substrate and a second surface which is generally parallel to the surface of the substrate, said method comprising the step of:
forming a spacer of phase-shifting material on the first surface of the opaque pattern by depositing phase-shifting material on the surfaces of the opaque pattern and the transparent substrate, the spacer having a thickness at the first surface of the opaque pattern such that exposing radiation passing through the spacer is phase-shifted in the range of 0.67 pi to pi radians with respect to exposing radiation passing through other areas of the mask, and the spacer having a generally curvilinear, cross sectional configuration.

12. The method as recited in claim 11 wherein the forming step further comprises the step of etching the phase-shifting material to substantially remove it from the generally parallel surfaces of the opaque pattern and the transparent substrate.

13. The method as recited in claim 11 wherein the thickness of the spacer at the first surface of the opaque pattern is substantially equal to a thickness of the opaque pattern.

14. The method as recited in claim 13 wherein a cross-sectional shape of the spacer is a quarter-cylinder with its greatest thickness at the first surface of the opaque pattern so that the greatest phase-shift of the exposing radiation is created at the first surface of the opaque pattern.

15. A method of making a semi-conductor mask by means of a single patterning sequence, said method comprising the steps of:
forming a pattern of material, which is non-transmissive of a given energy wavelength, on a substrate, which is transmissive of the given wavelength, by exposing the mask to only one patterning sequence, the patterned material and the substrate each having surfaces which are nonparallel to one another; and
forming a spacer of phase shifting material against the non-parallel surfaces of the patterned material and the substrate.

16. The method as in claim 15, wherein during said spacer forming step the phase shifting material is deposited and then etched.

17. The method as in claim 16, wherein the phase shifting material is etched to have a generally curvilinear, cross sectional configuration.

18. The method as in claim 16, wherein the phase shifting material is etched to be a thickness which is substantially equal to the thickness of the patterned material.

* * * * *